US005930147A

United States Patent [19]
Takei

[11] Patent Number: 5,930,147
[45] Date of Patent: Jul. 27, 1999

[54] DESIGN SUPPORT SYSTEM IN WHICH DELAY IS ESTIMATED FROM HDL DESCRIPTION

[75] Inventor: Tsutomu Takei, Kanagawa-ken, Japan

[73] Assignee: Kabushiki Kaisha Toshiba, Kawasaki, Japan

[21] Appl. No.: 08/724,471

[22] Filed: Oct. 1, 1996

[30] Foreign Application Priority Data

Oct. 12, 1995 [JP] Japan ..................................... 7-264320

[51] Int. Cl.⁶ ............................. G06F 17/00; G06F 17/50
[52] U.S. Cl. ......................... 364/488; 364/489; 364/490; 364/491; 364/578
[58] Field of Search .................................. 364/488–491, 364/578; 395/500

[56] References Cited

U.S. PATENT DOCUMENTS

| | | | |
|---|---|---|---|
| 5,491,640 | 2/1996 | Mahmood et al. | 364/488 |
| 5,519,627 | 5/1996 | Mahmood et al. | 364/488 |
| 5,541,850 | 7/1996 | Vander Zanden et al. | 364/491 |
| 5,544,071 | 8/1996 | Keren et al. | 364/489 |
| 5,623,418 | 4/1997 | Rostoker et al. | 364/489 |
| 5,726,902 | 3/1998 | Mahmood et al. | 364/489 |
| 5,764,525 | 6/1998 | Mahmood et al. | 364/488 |

OTHER PUBLICATIONS

Ramachandran et al "Combined Topological and Functionality–Based Delay Estimation Using a Layout–Driven Approach for High–Level Applications,"IEEE, pp. 1450–1460, Dec. 1994.

Kedem et al "ASIC Design with OASIS," IEEE, pp. 2580–2583, 1990.

Kumar et al "Emulation Verification of the Motorola 68060", IEEE, pp. 150–158, Oct. 1995.

Fischer et al "NETHDL: Abstract of Schematics to High–Level HDL," IEEE, pp. 90–96, Mar. 1990.

Hu et al "A Methodology for Design Verification," IEEE, pp. 236–239, Sep. 1994.

Paulin et al "High–Level Synthesis and Codesign Methods: An Application to a Verification Codec," IEEE, pp. 444–451, Sep. 1995.

*Primary Examiner*—Kevin J. Teska
*Assistant Examiner*—Vuthe Siek
*Attorney, Agent, or Firm*—Foley & Lardner

[57] ABSTRACT

A design support device 1 has a module division and merger section 8 for receiving a result from a HDL analysis section 6 to analyze a HDL description of a RTL and for dividing and merging the modules based on instructions from outside or automatically, a module allocation section 10 for allocating the modules by using the result from the module division and merger section 8 and the analyzed result by the HDL analysis section 6, a budgeting section 11 for budgeting an area, a shape, a timing, and a power consumption to each of the modules allocated by the module allocation means 10, and an estimation section for estimating module information for the result from the module division and merger section 8 and the result from the module allocation section 10.

8 Claims, 4 Drawing Sheets

```
entity TOP is
port(A_CLOCK: in STD_LOGIC;
     RST:     in STD_LOGIC;
     ~
end TOP;
architecture structure of TOP is
signal S: STD_LOGIC;
~
~
begin
M1:M1 port map
   (A_CLOCK,RST,~,S,~);
M2:M2 port map
   (A_CLOCK,RST,~,S,~);
M3:M3 port map
   (A_CLOCK,RST,~,S,~);
~
end;
```

FIG.4B

```
entity TOP is
port(A_CLOCK: in STD_LOGIC;
     RST:     in STD_LOGIC;
     ~
end TOP;
architecture structure of TOP is
signal S1,S2: STD_LOGIC;
~
~
begin
M1:M1 port map
   (A_CLOCK,RST,~,S1,S2,~);
M2:M2 port map
   (A_CLOCK,RST,~,S1,~);
M3:M3 port map
   (A_CLOCK,~,S2,~);
~
end;
```

FIG.4C

```
entity M1 is
port(A_CLOCK: in STD_LOGIC;
     S:       out STD_LOGIC;
     ~
end M1;
architecture RTL of M1 is
~
  S<=CONT(7);
~
end;
```

FIG.4D

```
entity M1 is
port(A_CLOCK: in STD_LOGIC;
     S1,S2:   out STD_LOGIC;
     ~
end M1;
architecture RTL of M1 is
~
  S1<=CONT(7);
  S2<=CONT(7);
~
end;
```

DESIGN SUPPORT SYSTEM IN WHICH DELAY IS ESTIMATED FROM HDL DESCRIPTION

BACKGROUND OF THE INVENTION

1. Field of the Invention

The present invention relates to a design support device and a design support system used in design and development processes for logical circuit systems such as semiconductor integrated circuits and the like, and more particularly, it relates to a design support device and a design support system for estimating performances of logic circuits, for allocating positions or locations of modules, and for designing areas and timings of modules before logical synthesis operation or before a logical gate design and a layout design which are performed during a register transfer level to a gate design level.

2. Description of the Prior Art

Recently, there is a method of counting the number of actual logic gates and of investigating delay time periods of signals transferred between the actual logic gates that are generated by a logical synthesis operation as a method of counting the number of gates and of calculating delay time periods between gates by using a Hardware Description Language (hereinafter referred to as "HDL") in a Register Transfer Level (hereinafter referred to as "RTL") which is commonly used as a design language for a logic design of semiconductor integrated circuits and the like. However, this method has a drawback that it requires a long time period to perform the logical synthesis operation.

In addition, there is a floor planner performing a floor-plan operation for allocating modules by using a logic gates, namely a net list, in a gate design level after the completion of the logic synthesis operation and the like, as an allocating method of allocating each module in a semiconductor chip. However, this floor planner executes the floor plan operation by using results which have already been converted into the logic gate level. Therefore, it is difficult to allocate modules on a semiconductor chip during the RTL design level performed before the gate design level.

As described above, in the prior art, it is not performed to estimate the performance of logic circuits and not to allocate modules on a semiconductor chip during the RTL design level which is the stage before the gate design level. The logical synthesis operation described above performed before the gate design level must be repeated many times or repeated manually when a designer does not satisfy the result synthesized logically during the RTL design level. Thus, there is the drawback in the prior art that the number of design iterations becomes high.

In addition, there is a drawback that the number of design iterations becomes high because it is difficult to converge the design operation when the result of a placement operation and a wiring operation become bad, specifically, when the length of wiring becomes long and when the delay time of a signal transfer in a module becomes long in the placement and wiring operation for logic gate circuits obtained by the logical synthesis operation performed by automatic processes or manually.

Furthermore, a designer estimates the number of gates in each module, a delay time in each module, and roughly allocates the position of each module on a semiconductor chip in the RTL design level based on the experience of the designer when the design for a semiconductor integrated circuit in a large circuit size is performed. However, the designer can not design and estimate accurately the number of gates and the delay time. Moreover, there is no design circumstances such as a top down design method in the prior art in which the logical synthesis operation and the layout operation can be performed by using the estimation result roughly designed by the designer. Accordingly, the number of design iterations is increased.

Thus, it is not disclosed in the prior art to estimate the performance of logic circuits and to allocate modules on a semiconductor chip during the RTL design level. Therefore the number of design iterations is increased and the logical synthesis operation and the layout operation must be repeated many times when a designer does not satisfy the result of the logical synthesis operation or the layout operation, so that the efficiency of the design operation becomes low and it takes a long time to execute the design operation of semiconductor integrated circuits.

SUMMARY OF THE INVENTION

Accordingly, an object of the present invention is, with due consideration to the drawbacks of the conventional design support device, to provide a design support device and a design support system for supporting a top down design process for logic circuits and is capable of designing semiconductor integrated circuits of a large circuit size having a high performance within a short time period.

In accordance with a preferred embodiment according to the present invention, a design support device comprises: analysis means for receiving a Hardware Description Language (HDL) description described by a HDL of a register transfer level (RTL) and for analyzing the HDL description; division and merger means for receiving the analyzed HDL description transferred from the analysis means and for dividing and merging the HDL description; HDL description generation means for adding a result from the division and merger means to the analyzed HDL description and for generating a HDL description; module allocation means for allocating modules in consideration of the number of gates in logic gates, an area of a module, an area of a module including a wiring field between modules, a shape of a module, a delay time of a signal in a path, power consumption, information of wirings between modules based on the result transferred from the division and merger means and the analyzed HDL description executed by the analysis means; and designation generation means for generating and providing designations used for a logical synthesis device and a layout device and for generating and providing a HDL description of a gate design level based on the analyzed HDL description executed by the analysis means, the HDL description generated by the HDL description generation means, and the result from the module allocation means.

In accordance with another preferred embodiment according to the present invention, a design support device comprises: analysis means for receiving a Hardware description Language (HDL) description described by a HDL of a register transfer level (RTL) in which function test of logic circuits have been completed or being performing and for analyzing the HDL description; division and merger means for receiving the analyzed HDL description transferred from the analysis means and for dividing and merging the HDL description; HDL description generation means for adding a result from the division and merger means to the analyzed HDL description obtained from the analysis means and for generating a HDL description; module allocation means for allocating modules in consideration of the number of gates, an area of a module, an area of a module including a wiring field, a shape of a module, a delay time of a signal in a path, a power consumption, information of wirings between modules based on the result transferred from the division and merger means and the analyzed HDL description executed by the analysis means; budgeting means for budgeting an area, a shape, a timing, and a power consumption to each module allocated by the module allocation means; estimation means for estimating module allocation information based on the analyzed HDL description executed by the analysis means, the result of the division and merger means, and the allocation result from the module allocation means, and for providing a result of the estimation to the module allocation means; and designation generation means for generating and providing designations used for the logic synthesis operation by a logical synthesis device and designations use for a layout operation by a layout device based on the analyzed HDL description executed by the analysis means, the HDL description generated by the HDL description generation means, the result from the module allocation means, and the result from the budgeting means.

In accordance with another preferred embodiment according to the present invention, in the design support device described above, the module allocation means extracts data signals by analyzing the HDL description of the RTL and for selecting a main data path having a critical timing by analyzing a data flow in the HDL description of the RTL, for dividing and merging blocks forming the main data path, for determining a block allocation order in the main data path, for estimating a block allocation order in the main data path to select the most suitable block allocation order, for generating limiting conditions and designations to be used for a logical synthesis operation and a layout operation, and for allocating modules.

In accordance with another preferred embodiment according to the present invention, the design support device described above, the designation generation means for the logical synthesis and layout operations modifies the HDL description of each module which is a target of a logical synthesis operation based on module and block allocation information in consideration of a signal connection relationship between modules before the logical synthesis operation.

In accordance with another preferred embodiment according to the present invention, a design support system comprises: Register transfer level (RTL) hardware description Level (HDL) memory means for storing a HDL description of a RTL design level; the design support device as described above for receiving the HDL description from the RTL HDL memory means; and Gate level HDL memory means for receiving and storing the HDL description transferred from the design support device.

BRIEF DESCRIPTION OF THE DRAWINGS

These and other objects, features, aspects and advantages of the present invention will become more apparent from the following detailed description of the present invention when taken in conjunction with the accompanying drawings, in which.

DESCRIPTION OF THE PREFERRED EMBODIMENTS

Other features of this invention will become apparent through the following description of preferred embodiments which are given for illustration of the invention and are not intended to be limiting thereof.

A preferred embodiment of a design support device according to the present invention will now be described with reference to the drawings.

Figure 1:
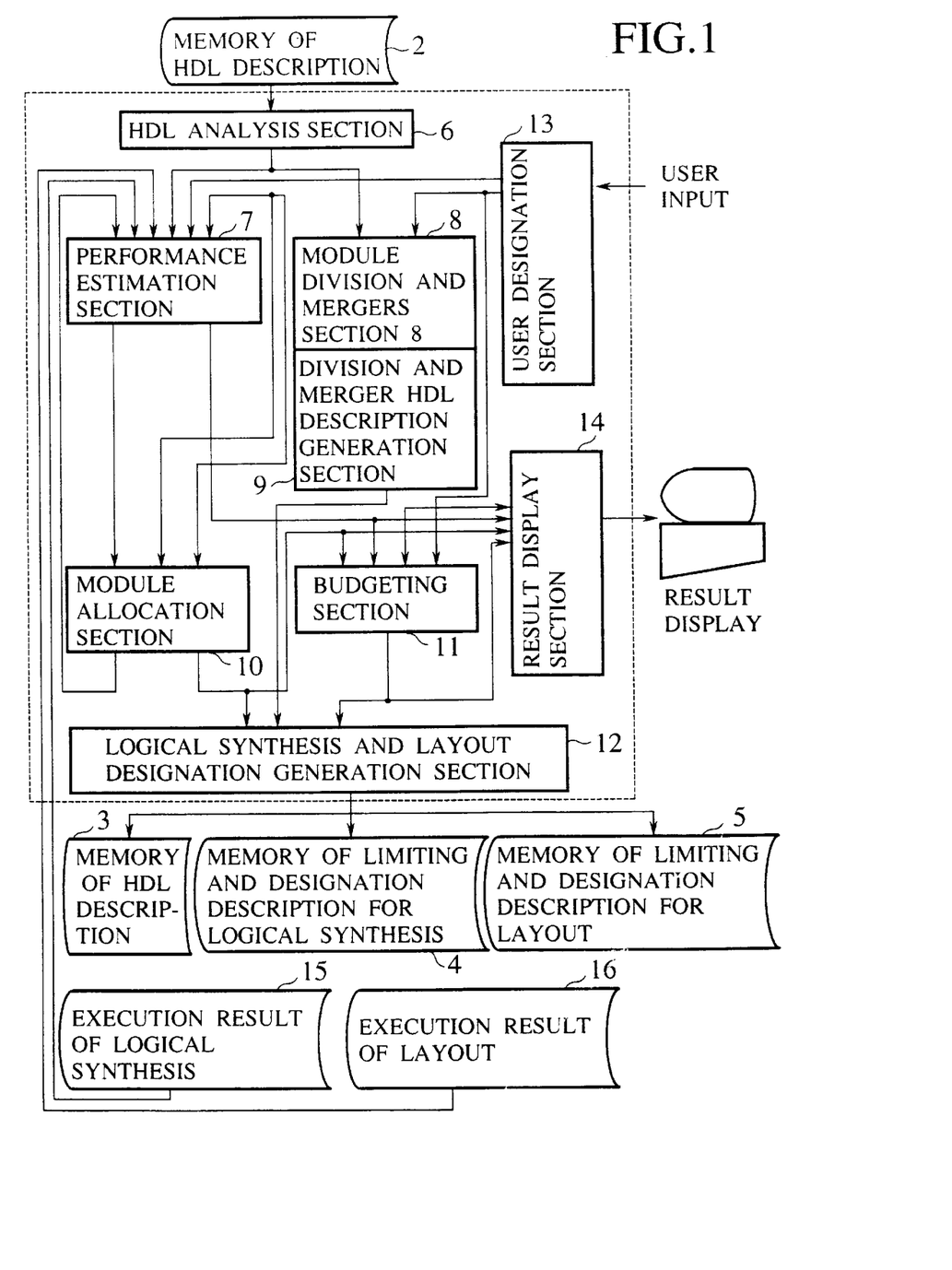
FIG. 1 is a diagram showing a configuration of a design support device as a preferred embodiment according to the present invention.

FIG. 1 is a diagram showing a configuration of a design support device as a preferred embodiment according to the present invention.

In FIG. 1, reference number 1 designates the design support device of the embodiment. A design support system comprises the design support device 1 of the preferred embodiment, a HDL (Hardware description Language) description memory 2 for storing HDL descriptions as an input section, a HDL (Hardware description Language) description memory 3 for storing HDL descriptions as an output section, a memory section 4 for storing limiting and designation descriptions for logical synthesis operation, and a memory section 5 for storing limiting and designation descriptions for layout operation.

The HDL description stored in the memory section 2 is a HDL description in a performance design level and is a RTLHDL (Register Transfer Level Hardware Description Language) description and is not a HDL description (or a net list) in a logic gate level which indicates the connection relationship between gate cells in a gate cell library obtained by the logical synthesis or a logical design done manually.

However, there is a case that a description for each of modules forming a LSI (Large Scale Integrated circuit) chip is a RTLHDL and a description indicating the connection relationship between modules is a net list.

The HDL description stored in the memory section 3 as output from the design support device 1 is a HDL description which has been obtained by division and merger operations or obtained by changing signal flows connected between modules so that a designer will satisfy the results of a logical synthesis operation and a layout operation and so that limiting conditions obtained from the design support device 1 enter a controllable range.

The limiting and designation descriptions for the logical synthesis stored in the memory section 4 are limiting conditions and designation descriptions used for logical synthesis tools (not shown). This limiting conditions and designation descriptions are descriptions such as limiting conditions of input/output signals for objects of the logical synthesis operation, limiting conditions of timings of specified paths, the number of gates, the number of wirings, the condition of the power consumption of each module and the like in order to obtain a result desired by a designer.

The limiting and designation description used for a layout operation stored in the memory section 5 are limiting and designation descriptions for a layout tool. These descriptions give global limiting to the layout tool, for example, limitation of an area size of each module, a position of each module, and terminal positions of wirings between modules, in a performance design level in order to obtain a result desired by a designer.

The design support device 1 forms the design support system shown in FIG. 1. The design support device 1 comprises a HDL description analysis section 6, a performance estimation section 7, a module division and merger section 8, a division and merger HDL description generation section 9, a module allocation section 10, a budgeting section (budgeting means) 11, a logical synthesis and layout section 12, a user indication section 13, and a result display section 14.

Conventional design support devices (not shown) to convert HDL descriptions in a RTL design level to HDL descriptions in a gate design level perform only the logical synthesis operation. In other words, the conventional design support devices (not shown) use only the function of the logical synthesis operation, for example, executed by the logical synthesis and layout indication section 12 in the design support device 1 of the embodiment, as shown in FIG. 1.

Next, each of the components in the design support device 1 of the preferred embodiment will now be explained.

The HDL description analysis section 6 receives the HDL description, as input of the design support device 1, transferred from the HDL description memory section 2 and analyzes this HDL description.

The performance estimation section 7 receives the result of the analysis operation executed by the HDL description analysis section 6 and estimates the number of logic gates, an area of a module, an area of a module including a wiring field, the shape of a module, the delay time of a path, a power consumption and the like by using this result of the analysis operation. In addition, the performance estimation section 7 also estimates the number of logic gates, an area of a model, an area of a module including a wiring field, a shape of a module, a delay time of a path, power consumption and the like based on a result of a division and merger operation executed by the module division and merger section 8. Furthermore, the performance estimation section 7 also estimates the area of a wiring filed between modules and the delay time in a wiring for a result obtained by a module allocation operation executed by the module allocation section 10. Moreover, the performance estimation section 7 receives a library technology designated by the user designation section 13, a matrix size of modules, positions of pads for receiving external signals and an operation frequency and then estimates a performance of each module or each block or an entire of a LSI.

The module division and merger section 8 performs the division and merger operations interactively or executes them automatically based on instructions from a designer in order to obtain a result of a desired logical synthesis and to obtain a desired result of a layout operation.

The division and merger HDL description generation section 9 generates the result, as HDL descriptions, obtained by the division and merger operations performed by the module division and merger section 8 by using the analyzed result transferred from the HDL description analysis section 6.

The module allocation section 10 allocates modules on a semiconductor chip interactively based on instructions from a designer or automatically in order to increase the performance of a LSI by using the result of the division operation and the merger operation executed by the module division and merger section 8 or the result of the analysis operation executed by the HDL description analysis section 6 when the division and merger operations are not executed. In addition, the module allocation section 10 executes the module allocation operation based on the number of logic gates, an area of a module, an area of a module including a wiring field, a shape of a module, a delay time of a path, a power consumption of a LSI which have been estimated by the performance estimation section 7 and module allocation information including the wiring relationship between modules.

The budgeting section 11 budgets a timing, an area, a shape, and a power consumption of each module.

The logical synthesis and layout designation generation section 12 divides a wiring through which a signal is transferred between modules into a plurality of wirings through which logically same signals are transferred between modules by changing the HDL descriptions based on a wiring relationship between modules, limiting conditions of timing transferred from the budgeting section 11, and the drive performance of gates receiving fan-outs of input terminal signals from modules and output terminal signals from modules in order to reduce delays of signals transferred between the modules against the HDL descriptions transferred (as the result of the division and merging operation) from the division and merger HDL description generation section 9 or the HDL descriptions transferred from the HDL description analysis section 6.

The logical synthesis and layout designation generation section 12 also generates limiting conditions of input/output signals, timing condition of specified paths, and limiting conditions of the number of gates, wirings, and power consumption for each logical synthesis target which will be used by a logical synthesis tool (not shown). In addition, the logical synthesis and layout section 12 generates an area of each module, a shape of each module, a size of each module, a position of each module, a range of terminal positions for wirings between modules, and timing conditions of specified paths, which will be used by a layout tool (not shown).

Through the user designation section 13, a designer indicates a library technology, the size of a matrix, pad positions for external signals, an operational frequency, a module division and merge designation, and budgeting designations such as a timing, an area, a shape, power consumption and the like. These designations are transferred to the performance estimation section 7, the module division and merger section 8, the module allocation section 10, and the budgeting section 11.

The result display section 14 displays a result of the performance estimation operation, hierarchy relationships between modules before and after the module division and merger operation, a result of the module allocation operation, a wiring relationship between modules, and budgeting conditions such as a timing, an area, a shape, a power consumption of each module, and the like for a designer.

As clearly shown in FIG. 1, the design support system comprises the design support device 1, the memory section 15 storing the logical synthesis execution results which have already been executed for some modules and the memory section 16 storing the layout execution results.

The memory section 15 stores the logical synthesis execution results, for example, gate connection information in the gate design level which have already been synthesized, delay information, information of the number of gates and the like. It can be acceptable to store these information in advance into the memory section 15.

This information in the memory section 15 is transferred to the performance estimation section 7 and then used, as information of function blocks which has already synthesized, by the performance estimation section 7.

The memory section 16 stores the layout execution results, for example, information of a position and a shape of each logic module, information of a length of a wiring through which a signal is transferred between modules and a signal delay time between modules, information of a wiring length and a delay time in each module, and information of cell positions in each module, a length of a wiring for a signal transmission, and a delay time when cells are allocated in the gate design level. This information is transferred to the performance estimation section 7 and then used as the result of layout operation instead of estimation data items.

Next, operations of main sections incorporated in the design support device 1 will now be explained.

In the design support device 1 having the above configuration, the HDL description, as input of the HDL analysis section 6, stored in the HDL description section 2 is analyzed by the HDL analysis section 6. The result of the HDL analysis section 6 is transferred to the performance estimation section 7.

The performance estimation section 7 estimates the number of logic gates, an area, a wiring field, a delay time of a path, a power consumption and the like by using the analyzed result from the HDL description analysis section 6.

In addition, the result analyzed by the HDL description analysis section 6 is also transferred to the module division and merger section 8 in order to obtain a layout result desired by a designer. The module division and merger section 8 divides and merges modules interactively or automatically according to indications of the designer transferred through the user indication section 13. The result from the module division and merger section 8 is transferred to the performance estimation section 7. Then, the performance estimation section 7 receives this result from the module division and merger section 8 and estimates the number of gates, an area, an area of a module including a wiring field, a shape, a delay time of a path in each module by using this result.

In addition, change of the data items executed by the division and merger section 8 are transferred to the division and merger HDL description generation section 9. The generation section 9 generates a HDL description based on the change of the data items described above and the result of the HDL description analyzed by the HDL analysis section 6.

The module allocation section 10 allocates modules interactively or automatically in order to increase the performance of a LSI by using the result from the module division and merger section 8, or by using the analyzed result from the HDL analysis section 6 when the division and merger operations at the module division and mergers section 8 are not executed, based on instructions from a designer transferred through the used indication section 13. At this time, the module allocation section 10 also allocates the modules in consideration of the number of gates, an area, an area of a module including the wiring field, a shape, a delay time of a path, a power consumption and the like which have been estimated by the performance estimation section 7. The result such as an area of wirings between modules, a signal delay in a wiring and the like transferred from the module allocation section 10 are also estimated by the performance estimation section 7.

On the other hand, information such as a timing, an area, a shape, a power consumption and the like for each module are budgeted by the budgeting section 11.

Thus, the HDL description from the division and merger HDL description generation section 9 or the HDL description from the HDL analysis section 6 is changed (for example, a signal through a wiring between modules is divided into signals of wirings between a plurality of modules) to a HDL description as an output of the design support device 1 by the logical synthesis and layout indication generation section 12 in consideration of: the module allocation relationship obtained by the module allocation section 10; the limiting conditions of timings obtained by the budgeting section 11; and the limiting condition of a driving ability of each gate connected to a fan-out of input terminal and output terminals in order to reduce the signal delay between modules. The HDL description as an output from the design support device 1 is transferred to and stored into the memory section 3.

Further, the logical synthesis and layout indication section 12 generates a limiting condition of input/output signal to each logical synthesis object, a limiting condition of a timing for a specified path, the number of gates and wirings, a limiting condition of a power consumption and the like. These limiting conditions used for a logical synthesis tool (not shown) are transferred to and stored into the memory section 4 for storing the limiting indication description for the logical synthesis operation.

Moreover, the logical synthesis and layout indication section 12 also generates a limiting condition of an area and a shape, a position, a range of a terminal position of a wiring between modules, a timing of a specified path and the like for each model used for the layout tool (not shown) and then transferred to and stored into the memory section 5 for storing the limiting descriptions for the layout tool.

As described above, in the design support device 1 of the preferred embodiment according to the present invention, the following operations are executed: the estimation operation of a performance of each logic gate such as the number of gates and a delay time in each logic gate; the floor plan operation of modules to allocate each module on a semiconductor chip; the suitable budgeting operation of an area and a timing for each module; and the limiting condition generation operation for generating the limiting conditions used for the logical synthesis tool and the layout tool. Therefore, the design iteration can be reduced and the design efficiency can be increased, so that a top-down design operation to design a LSI having a large circuit size and a high performance can also be easily executed within a short time period.

Figure 2:
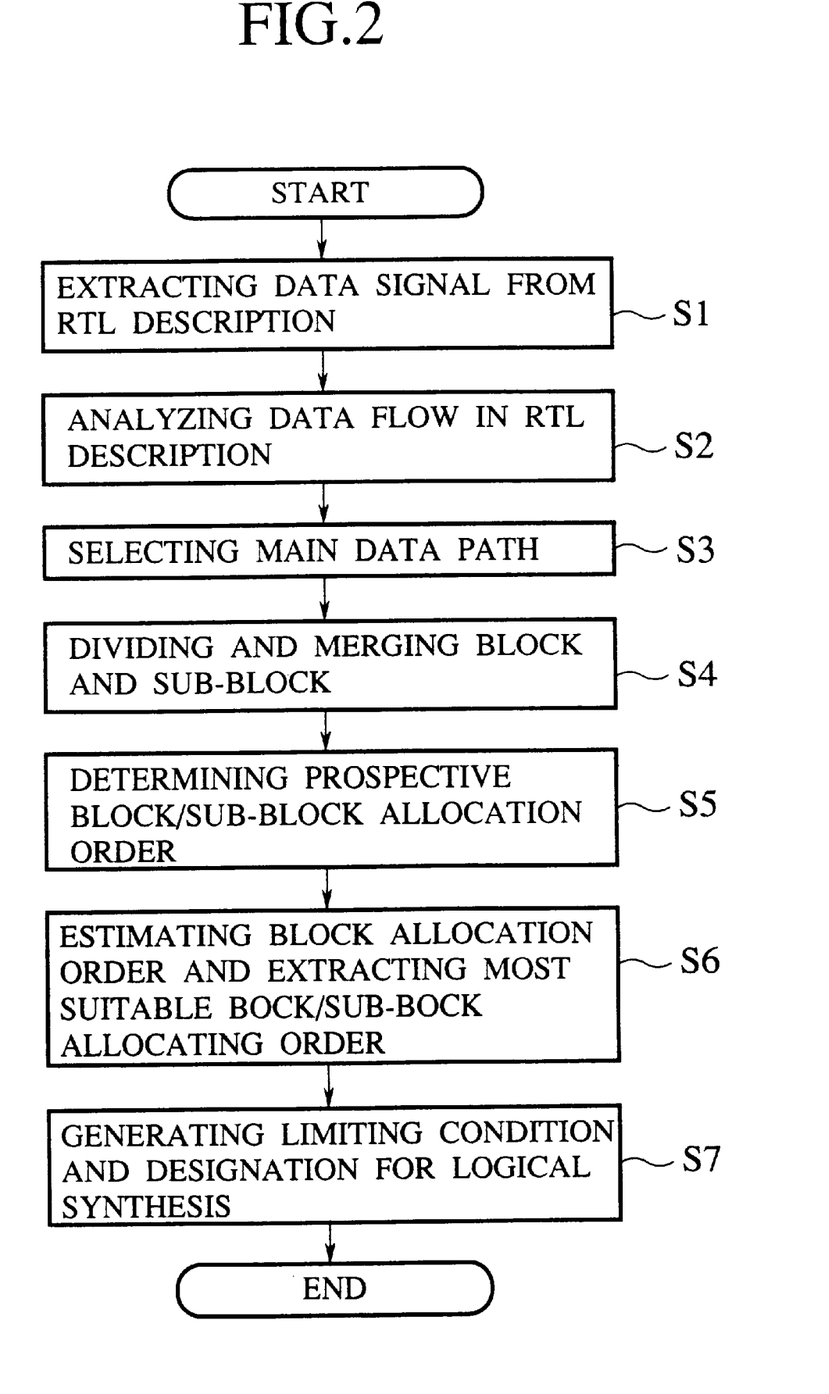
FIG. 2 is a process flow of a module allocation section 10 in the design support device of the embodiment according to the present invention shown in FIG. 1.

FIG. 2 shows a process flow in order to reduce a delay time of a data path executed by the module allocation section 10 incorporated in the design support device 1 of the preferred embodiment according to the present invention shown in FIG. 1.

In FIG. 2, first, the HDL analysis section 6 analyzes the RTL HDL description stored in the HDL memory section 2 in order to extract a data signal. The extracted data signal is a signal which has a larger bit width (or a fully bit range), for example, input [31:0] DB; output [31:0] OB, write [31:0] IR, DD and the like) in the RTL HDL description.

When a range of data signal is not used and when a one bit description is described in the RTL description, for example, write DAT 000, DATA 00, DATA 01, DATA 02, . . . , a data signal is extracted by using a name (signal name+a number) (see Step S1).

Next, the relationship of a data flow in the RTL description is analyzed. Then, the data flow map is generated temporarily in the design support device 1 in order to analyze the data flow of the extracted data signal between statements such as a block, a sub-block, a statement, and the relationship between input data signals in each statement (Step S2).

Next, the data path having a critical path in timing is selected by using an instruction from a designer.

After this, an allocation or a position of a data path block is determined so that the wiring length of this data path is reduced in order to reduce the delay of the data path (Step S3).

Next, a block forming a section of the data path is divided and merged in consideration of a module hierarchy in the RTLDHL description, a relationship of data signals between a block hierarchy and each module/block, an operation condition and an operation timing such as an arithmetic process in each block, and a size in each block (Step S4).

Then, a block allocation order in a data path is determined (relative relationship of positions). Because there is ways of N! (N means the number of blocks) for prospective targets in the block allocation order, the number of these prospective targets are increased when the number of blocks is increased (for example, the number of prospective targets in the block allocation order becomes 3,600,000 ways when the number of blocks is 1000). Accordingly, it is difficult to estimate the allocation order of all prospective targets when the number of blocks becomes large. In order to overcome this problem, main data signal flows are selected. The blocks relating to the main data flows are selected as prospective targets of the a block allocation order. It can be acceptable to select blocks in consideration of the number of data signals transferred between blocks and timing conditions instead of the main data signal flows (Step S5).

Next, the most suitable block allocation order is extracted in the selected block allocation orders by estimating each block order to the main data path. The way to reduce a signal delay time by reducing the length of each wiring is selected as the estimation condition of the block allocation order. In order to estimate the wiring length, the height of each block and the height of wiring field between blocks must be estimated. The height of each block is estimated by using the number of gates in each block, the height of the wiring field between blocks is estimated by using the number of wirings (based on the number of wirings through paths, the number of wirings through areas other than the paths, and the number of wirings between an upper side block and a lower side block). The length of each wiring is estimated by using these blocks and the height of each block, and then the delay time of each wiring is estimated. Then, the estimation value including the gate delay time in each block and the delay time of wirings is compared with a timing condition value (Step S6).

Finally, limiting conditions/designations which will be used for a logical synthesis tool of a lower design level (or gate design level)/for a gate level floor planner/for a layout tool are generated based on the estimation values of delay times and areas in the RTL level in consideration of a floor plan (block allocation) in the RTL level and given timing limitation value and the chip size/the number of gates and the like (Step S7).

Next, the block division and merger operations based on the RTL descriptions performed in Step S4 in the processes described above will now be explained.

When an operation of a global floor-plan is performed in the RTL, it must be checked to satisfy required timings for main data paths which greatly affects the performance of a LSI to be designed. In other words, the module division and merge operations are performed so that the timing delay of a critical data path is reduced.

As the module division and merger operation, a clustering operation is performed in consideration of a connection degree between statements in the RTL description and the size of a block.

The degree of the connection of each statement is measured in consideration of following connection degrees:

(i) execution timings of arithmetic operations and the like (whether or not arithmetic operations are executed in a same clock step);

(ii) the number of connected wirings (or the number of receiving signals); and (iii) possibility that functions of blocks are grouped.

Then, by using the degrees of the connection described above, a clustering tree is generated. A cutting line is moved on the clustering tree in order to obtain clusters in consideration of block sizes (or the number of gates and wirings).

In general, because the RTL description to be given is described by using the module/entity and block statements in a hierarchy state, not in a flat state, namely one dimension, when the clustering operation is performed, the clustering tree including the RTL statement having a hierarchy structure is generated. In addition, the hierarchy structure functionally and structurally divided are reflected during the clustering operation when a designer makes the RTL description.

Next, the determination operation of the prospective block allocation order executed in Step S5 will be explained as follows.

There is the following procedures in order to determine a prospective block allocation order:

(a) The block allocation order is determined at random;

(b) Blocks having many data signals are placed on adjacent positions. A block having many inputs/many bi-directional signals/many output pins or many data signals connected to memory sections is placed at the end side is selected;

(c) Like the procedure (b) described above, blocks having a data signal transfer a relationship of strict timing conditions which are given by a designer are placed on adjacent positions.

(d) A main data signal transferred from input pins or memory sections is selected. Then, a block allocation order is determined in consideration of a signal flow from the main data signal to a following signal. Blocks which are not directly related to the main data signal are inserted based on a receiving relationship of other data signals;

(e) Like the process (d) described above, a block allocation order is determined in consideration of a plurality of main data signals; and (f) blocks that improves the value of an estimation function of a block allocation order when the positions of optional two blocks are replaced are selected and then Steps S5 and S6 shown in FIG. 2 are executed.

Next, the estimation operation of the block allocation order executed in Step S6 described above will be explained.

In the estimation operation for the block allocation order, a block allocation order having a smallest wiring delay when the wiring length between blocks is reduced is selected. In order to estimate the wiring length between blocks, the height of each block and the height of wiring field between blocks must be estimated. In this case, the following assumptions are made:

Assumption 1: The height of each block is proportional to the number (RTL estimation value) of gates in each block or becomes the function of the number of gates in each block.

Height of block i=fb (number of gates in block i, data processing bit width).

Assumption 2: The height of a wiring field in each block is proportional to the number of path wirings through the block, the number of wirings through wirings other than the paths, and a sum of the number of wirings between upper and lower blocks, or relates to the number of these wirings.

Height of wiring field i between blocks=fr (number of wirings passing through a path, number of wirings other than the path, number of wirings between upper and lower blocks, data processing bit width or maximum value of length of block).

Next, when a signal wiring i j passing through a block i to block j, the wirings i and (i+1) between blocks becomes a function of the height of wiring field i and the number i of wirings (number of path wirings passing through the wiring field i, number of wirings other than paths, and number of wirings between upper and lower blocks).

Length of wiring fields i, (i+1) between blocks
=f(height of wiring field i between blocks, number of wirings i)
=f(fr( ... ), number of wirings i)
=f1(number of wirings passing through block, number of wirings other than paths passing through block, number of signal wirings between upper and lower blocks, data processing bit width or maximum value of length of block).

Wirings between blocks (i+1), i are as follows:
Lengths of wirings (i+1), i between blocks
=height of block i+height of wiring field i between blocks
≈fb(number of gates in block i)+fr( ... )+fb(number of gates in block (i+1))+C(maximum value of length of block: constant).

A bus wiring from block i to block j is as follows:
Length of bus wirings i, j
≈½fb(number of gates)+$^{j-1}\Sigma fb_{K=l+1}$(number K of gates)+ ½fb(number i of gates).

Wirings passing through block i to block j,
Lengths of wirings i, j passing through blocks
≈$^{j-1}\Sigma fb_{K=l+1}$(number K of gates)+$^{j-1}\Sigma fr_{K=1}$(number K of gates)+C×maximum value of length of block.

Feed back wiring passing through block i to block j,
Lengths of feed back wirings j, i
≈$^{j}\Sigma fb_{k=1}$(number K of gates)+$^{j-1}\Sigma fr_{K=1}$(number K of gates)+C×maximum value of length of block.

In addition, a limiting condition for wirings between blocks is: Number of wirings i on a wiring field between blocks<
Upper limit of wirings between blocks; Number of wirings i passing through area above block<
Upper limit i of wirings above block.

In delay calculation in gate design level, Delay per stage of gate=Delay in gate+(output resistances input capacitance)+(output resistance×wiring capacitance)+ (wiring resistance×wiring capacitance).

Delay of gate group is:
=Σ{delay in gate+(output resistance×input capacitance)+ (output resistances wiring capacitance)}
=Σ{delay in gate+(output resistance×input capacitance)+ (output resistance×virtual wiring length capacitance)}.

In the estimation in RTL, a delay of this gate group is calculated based on RTL description elements.

The delay in a block is obtained by adding above delay of this gate group:
Delay in block is:
Delay of wiring between blocks=(output resistances wiring capacitance)+(wiring resistances wiring capacitance).

Timing limiting condition when a signal is transferred from a register in a block i to a register in a block j is as follows:
(delay of wiring between blocks i, j+delay in gate group in block i+delay of gate group in block j)<timing limiting condition.

The signal transfer delay time in a data path can be reduced as small as possible by allocating modules according to these processing procedures.

Figure 3A:
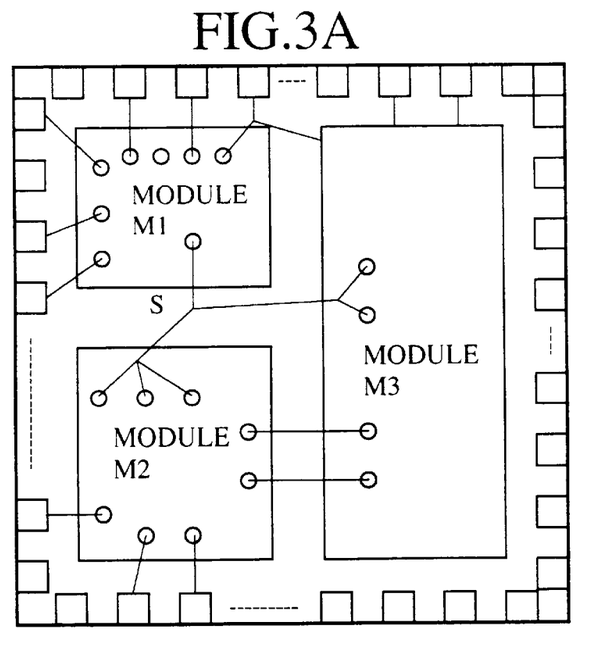
FIGS. 3A and 3B are circuit diagrams for explaining the changes of HDL descriptions executed by the design support device of the preferred embodiment according to the present invention shown in FIG. 1.
Figure 3B:
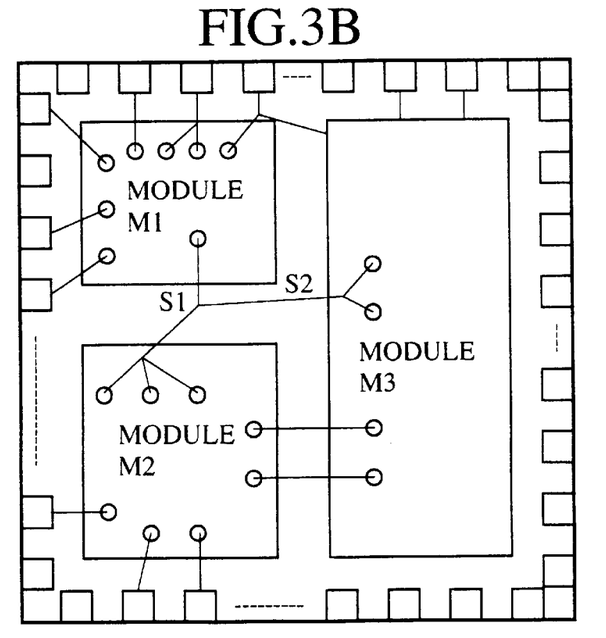

FIGS. 3A and 3B are circuit diagrams for explaining the changes of HDL descriptions executed by the design support device 1 of the preferred embodiment according to the present invention shown in FIG. 1.

In FIG. 3A, a floor-plan for modules M1, M2 and M3 is shown. In FIG. 3A, configurations in the modules M1, M2, and M3 are described by using RTL descriptions which are the configurations before the logical synthesis operation. The signal "S" from the module M1 is transferred to the modules M2 and M3. This signal S is then transferred to a plurality of RTL description elements in the modules M2 and M3.

In the level of this floor plan, the wiring length between the modules is estimated by using the distance between the modules. Then, the signal delay between the modules is estimated in consideration of the RTL description elements connected to points in each module. Here, when a signal delay between modules is increased, as shown in FIG. 3B, signal wirings are divided into wirings between the modules M1 and M2 and wirings between the modules M1 to M3.

FIGS. 4A, 4B, 4C and 4D are explanation diagrams showing HDL descriptions corresponding to FIGS. 3A and 3B used in the design support device 1 of the preferred embodiment according to the present invention shown in FIG. 1.

Figure 4A:
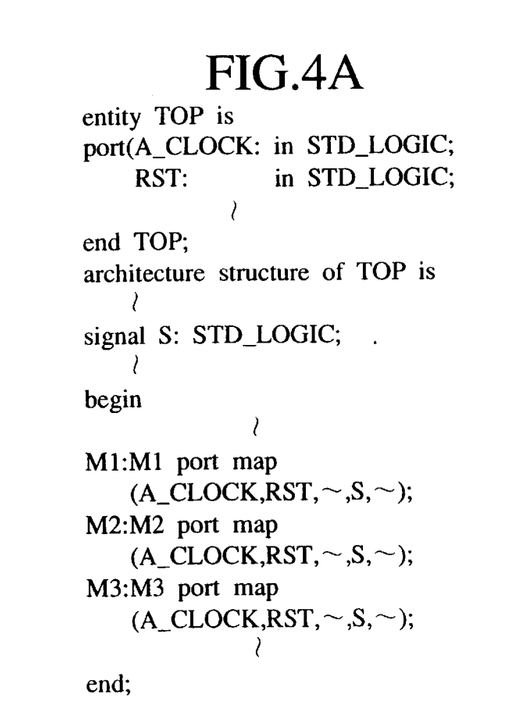
FIGS. 4A, 4B, 4C and 4D are explanation diagrams showing HDL descriptions used in the design support device of the preferred embodiment according to the present invention shown in FIG. 1.
Figure 4B:
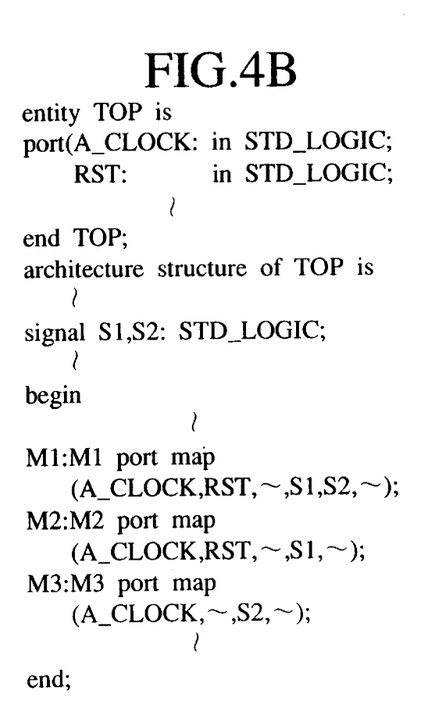

FIG. 4A shows the HDL description of a top level by VHDL (Very High speed IC description Language) corresponding to the example shown in FIG. 3A. FIG. 4A shows the connection relationship between modules M1, M2, and M3 and input/output signals. FIG. 4B shows the HDL description of a top level by VHDL corresponding to the case shown in FIG. 3B.

Although the signal S is used as the connection signal between the modules M1, M2, and M3 in FIG. 4A, the signal S1 becomes a connection signal between the modules M1 and M2 and the signal S2 becomes the connection signal between the modules M1 and M3.

Thus, the HDL description of each module to be a target of the logical synthesis operation is also changed before the logical synthesis operation by predicting that the signal delay between modules can be reduced.

Figure 4C:
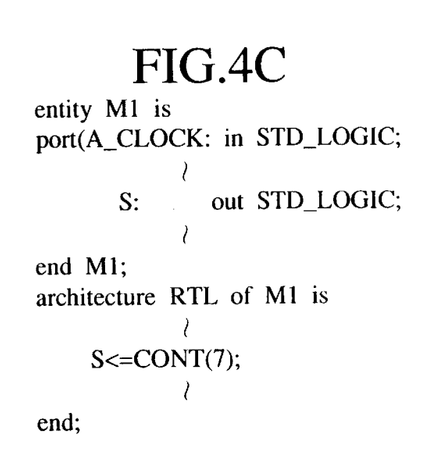

FIG. 4C shows a part of the HDL description of the module M1 before changing. The reference character "S" designates the output signal of the module corresponding to the signal S output from the module M1 to the modules M2 and M3.

Figure 4D:
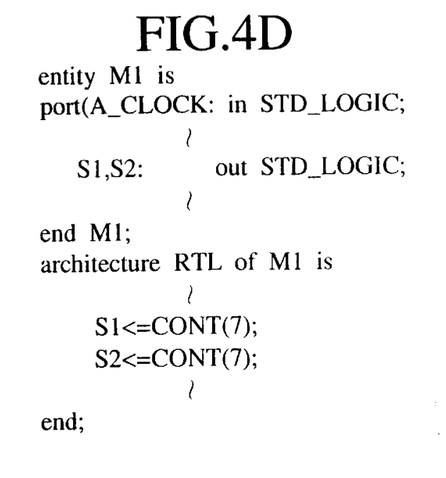

FIG. 4D shows a part of the HDL description of the module M1 after changing. Reference characters 1 and S2 indicate output signals from the module divided into the signal S1 transferred from the module M1 to the module M2 and the signal S2 transferred from the module M1 to the module M3.

Thus, in order to reduce the signal delay between modules as small as possible, the design support device 1 of the preferred embodiment can change the HDL description before the logical synthesis operation in addition to executing of the logical synthesis operation executed by a logical synthesis device and the floor-plan operation executed by a floor-planner and the layout operation. Thereby, the logical connection relationship of the HDL description in the gate design level after the logical synthesis operation, the physical connection relationship in a floor plan layout, and the HDL description before the logical synthesis operation can kept consistently without any conflict.

As described above, the design support device according to the present invention can execute efficiently the following processes during the RTL design level: estimation of the number of gates and delay times of logic gates; a floor-plan operation in which modules are allocated on a semiconductor chip; budgeting of an area and a timing of each module appropriately; and generation of limiting conditions to a logical synthesis tool and a layout tool. Accordingly, it can be achieved to execute a top down design process easily and to design a LSI of a large circuit size and a high performance within a short design time period.

In addition, by using the design support device of the present invention, it can be achieved to reduce a signal delay of a data path section as small as possible.

Furthermore, by using the design support device of the present invention, it can be achieved to keep consistently a logical connection relationship between a HDL description after a logical synthesis operation, a physical connection relationship in a floor-plan layout, and a HDL description before the logical synthesis operation.

While the above provides a full and complete disclosure of the preferred embodiments of the present invention, various modifications, alternate constructions and equivalents may be employed without departing from the true spirit and scope of the invention. Therefore the above description and illustration should not be construed as limiting the scope of the invention, which is defined by the appended claims.

What is claimed is:

1. A design support device comprising:
   analysis means for receiving a Hardware Description Language (HDL) description described by a HDL of a register transfer level (RTL) and for analyzing the HDL description;
   division and merger means for receiving the analyzed HDL description transferred from the analysis means and for dividing and merging the HDL description;
   HDL description generation means for adding a result from the division and merger means to the analyzed HDL description and for generating a HDL description;
   module allocation means for allocating modules in consideration of a delay time of a signal in a path as estimated from the analyzed HDL description; and
   designation generation means for generating and providing designations used for a logical synthesis device and a layout device and for generating and providing a HDL description of a gate design level based on the analyzed HDL description executed by the analysis means, the HDL description generated by the HDL description generation means, and the result from the module allocation means.

2. A design support device as claimed in claim 1, wherein the module allocation means extracts data signals by analyzing the HDL description of the RTL and for selecting a main data path having a critical timing by analyzing a data flow in the HDL description of the RTL, for dividing and merging blocks forming the main data path, for determining a block allocation order in the main data path, for estimating a block allocation order in the main data path to select the most suitable block allocation order, for generating limiting conditions and designations to be used for a logical synthesis operation and a layout operation, and for allocating modules.

3. A design support device as claimed in claim 1, wherein the designation generation means for the logical synthesis and layout operations modifies the HDL description of each module which is a target of a logical synthesis operation based on module and block allocation information in consideration of a signal connection relationship between modules before the logical synthesis operation.

4. A design support system comprising:
   Register transfer level (RTL) hardware description Level (HDL) memory means for storing a HDL description of a RTL design level;
   the design support device as claimed in claim 1 for receiving the HDL description from the RTL HDL memory means; and
   Gate level HDL memory means for receiving and storing the HDL description transferred from the design support device.

5. A design support device comprising:
   analysis means for receiving a Hardware description Language (HDL) description described by a HDL of a register transfer level (RTL) in which function test of logic circuits have been completed or are being performing and for analyzing the HDL description;
   division and merger means for receiving the analyzed HDL description transferred from the analysis means and for dividing and merging the HDL description;
   HDL description generation means for adding a result from the division and merger means to the analyzed HDL description obtained from the analysis means and for generating a HDL description;
   module allocation means for allocating modules in consideration of the number of gates, an area of a module, an area of a module including a wiring field, a shape of a module, a delay time of a signal in a path, a power consumption, information of wirings between modules based on the result transferred from the division and merger means and the analyzed HDL description executed by the analysis means, wherein at least the delay time is estimated from the analyzed HDL description;
   budgeting means for budgeting an area, a shape, a timing, and a power consumption to each module allocated by the module allocation means;
   estimation means for estimating module allocation information based on the analyzed HDL description executed by the analysis means, the result of the division and merger means, and the allocation result from the module allocation means, and for providing a result of the estimation to the module allocation means; and
   designation generation means for generating and providing designations used for the logical synthesis operation executed by a logical synthesis device and designations use for a layout operation by a layout device based on the analyzed HDL description executed by the analysis means, the HDL description generated by the HDL description generation means, the result from the module allocation means, and the result from the budgeting means.

6. A design support device as claimed in claim 5, wherein the module allocation means extracts data signals by analyzing the HDL description of the RTL and for selecting a main data path having a critical timing by analyzing a data flow in the HDL description of the RTL, for dividing and merging blocks forming the main data path, for determining a block allocation order in the main data path, for estimating a block allocation order in the main data path to select the most suitable block allocation order, for generating limiting conditions and designations to be used for a logical synthesis operation and a layout operation, and for allocating modules.

7. A design support device as claimed in claim 5, wherein the designation generation means for the logical synthesis and layout operations modifies the HDL description of each module which is a target of a logical synthesis operation based on module and block allocation information in consideration of a signal connection relationship between modules before the logical synthesis operation.

8. A design support system comprising:

Register transfer level (RTL) hardware description Level (HDL) memory means for storing a HDL description of a RTL design level;

the design support device as claimed in claim 2 for receiving the HDL description from the RTL HDL memory means; and Gate level HDL memory means for receiving and storing the HDL description transferred from the design support device.

* * * * *